(12) United States Patent
Vassilev et al.

(10) Patent No.: US 7,030,461 B2
(45) Date of Patent: Apr. 18, 2006

(54) DEVICE FOR ELECTROSTATIC DISCHARGE PROTECTION

(75) Inventors: Vesselin K. Vassilev, Plovdiv (BG); Guido Groeseneken, Leuven (BE)

(73) Assignee: Interuniversitair Microelektronica Centrum (IMEC), Leuven (BE)

(*) Notice: Subject to any disclaimer, the term of this patent is extended or adjusted under 35 U.S.C. 154(b) by 126 days.

(21) Appl. No.: 10/652,394

(22) Filed: Aug. 29, 2003

(65) Prior Publication Data

US 2004/0120086 A1    Jun. 24, 2004

(30) Foreign Application Priority Data

Dec. 20, 2002    (EP) .................................. 02447263

(51) Int. Cl.
| | | |
|---|---|---|
| H01L 29/00 | (2006.01) | |
| H01L 23/62 | (2006.01) | |
| H01L 29/76 | (2006.01) | |
| H01L 29/94 | (2006.01) | |
| H01L 31/062 | (2006.01) | |
| H01L 31/113 | (2006.01) | |
| H01L 31/119 | (2006.01) | |

(52) U.S. Cl. ...................... 257/546; 257/373; 257/355
(58) Field of Classification Search ................ 257/355, 257/356, 360, 373, 375, 494, 495, 546
See application file for complete search history.

(56) References Cited

U.S. PATENT DOCUMENTS

| | | | | |
|---|---|---|---|---|
| 5,343,053 A | * | 8/1994 | Avery | ........................... 257/173 |
| 6,590,262 B1 | | 7/2003 | Jiang et al. | .................. 257/355 |
| 6,611,028 B1 | * | 8/2003 | Cheng et al. | ................ 257/361 |
| 6,788,507 B1 | * | 9/2004 | Chen et al. | .................... 361/56 |
| 6,815,775 B1 | * | 11/2004 | Ker et al. | ..................... 257/355 |
| 6,876,041 B1 | * | 4/2005 | Lee et al. | ..................... 257/358 |
| 6,914,305 B1 | * | 7/2005 | Kwon et al. | ................. 257/361 |
| 6,946,708 B1 | * | 9/2005 | Okazaki | ...................... 257/355 |

FOREIGN PATENT DOCUMENTS

| | | |
|---|---|---|
| EP | 0 803 955 A2 | 4/1997 |
| EP | 1 058 308 A1 | 12/2000 |

OTHER PUBLICATIONS

Duvvury, et al., "Substrate Pump NMOS for ESD Protection Applications", Electrical Overstress/Electrostatic Discharge Symposium Proceedings 2000, Sep. 26-28, 11 pgs.

(Continued)

Primary Examiner—Nathan J. Flynn
Assistant Examiner—Victor A. Mandala, Jr.
(74) Attorney, Agent, or Firm—McDonnell Boehnen Hulbert & Berghoff LLP

(57) ABSTRACT

The present invention is related to an Electrostatic Discharge protection device. This may be a semiconductor device such as a CMOS transistor, having a snap-back IV characteristic, in order to withstand ESD pulses. The device of the invention comprises an additional doped region, which influences the internal resistance of the substrate whereupon the device is built. This has a positive effect on the snap-back characteristic, putting the snap back trigger voltage and current at a lower value, compared to prior art devices.

21 Claims, 7 Drawing Sheets

OTHER PUBLICATIONS

Y. Blecher and R. Fried, "*Zener Substrate Triggering for CMOS ESD Protection Devices*", Electronics Letters, IEE Stevenage, Great Britain, Oct. 24, 1996, vol. 32, No. 22, 2 pgs.

A. Amerasekera, et al., "*Substrate Triggering and Salicide Effects on ESD Performance and Protection Circuit Design in Deep Submicron CMOS Processes*", Electron Devices Meeting, 1995, IEEE, Dec. 10, 1995, 4 pgs.

\* cited by examiner

DEVICE FOR ELECTROSTATIC DISCHARGE PROTECTION

RELATED APPLICATION

This application claims priority benefits under 35 U.S.C. § 119 to the European Patent Application EP 02447263 filed on Dec. 20, 2002. This application incorporates by reference in its entirety European Patent Application EP 02447263 filed on Dec. 20, 2002.

BACKGROUND

1. Field of the Invention

The present invention relates to Electrostatic Discharge (ESD) protection devices. These on-chip semiconductor structures protect circuits from ESD pulses.

2. Description of Related Art

ESD protection devices known in the art are transistors (PMOS/NMOS), thyristors or other devices, which are able to withstand ESD pulses. Most devices of this kind are called 'snap back' devices, because of their specific IV characteristic, which comprises a low-resistive mode of operation, which is activated at a given bias voltage, called the trigger voltage. This level of biasing causes equivalent parasitic bipolar transistors to become active in the device. The activation of the parasitic bipolar transistor is only possible when an internal bias has been created, as will be explained in more detail further on.

One of the main goals in the optimization of ESD protection devices consists in finding ways of decreasing the trigger voltage and current, i.e. to have the device snap back at lower ESD stress bias levels. In the state of the art, the way of doing this has been mainly based on trying to increase the substrate current, in order to obtain the necessary internal bias at lower external bias levels or to increase the avalanche current generation in ESD conditions by increasing the device normal operation current (e.g., in the channel, in the case of an NMOS device). Prior art publications dealing with this approach are:

- Duvvury et al., "Substrate Pump NMOS for ESD Protection Applications", Proceedings EOS (Electrical Overstress/ESD symposium), 2000, page 7–17.
- Y. Blecher, R. Fried "Zener Substrate Triggering for CMOS ESD Protection Devices", Electronic Letters, vol. 32, no. 22, $24^{th}$ Oct. 1996, page 2102–2103.
- A. Amerasekere et al, "Substrate Triggering and Salicide Effects on ESD Performance and Protection Circuit Design in Deep Submicron CMOS Process", Proceedings IEDM 1995, page 547–550.

The known techniques of enhanced substrate current generation are complex to realize. They require the design of additional control circuitry and take more design area.

SUMMARY

The present invention aims to provide an ESD protection device with improved characteristics compared to the prior art. In particular, the invention aims to provide an ESD protection device having a 'snap back' IV characteristic, wherein the trigger bias voltage and current is lower compared to existing devices, without injecting additional current.

The present invention is related to a semiconductor device for protecting electrical circuits from Electrostatic Discharge pulses. The device comprises a bulk region of a given doping type and a first region of a doping type, opposite the doping type of the bulk region. The first region is in physical contact with the bulk region. Also, the first region is connected to a first terminal to which an ESD pulse can be applied.

The device also comprises a second region of the same doping type as the bulk region. The second region is in physical contact with the bulk region and connected to a second terminal to which a reference voltage can be applied.

Still additionally, the device comprises a third region, which is equally in physical contact with the bulk region. The third region is positioned in between the first and second region. The third region is of the same doping type as the first region and the third region is floating with respect to the second terminal. The third region is used for controlling the resistance of a current path, through the bulk region, between the first and second region.

According to a preferred embodiment, the third region is connected to an external terminal. The external terminal may be separate from the first terminal. Alternatively, the external terminal may be connected to the first terminal. Preferably, the junction between the third region and the bulk region is reversed biased.

According to one embodiment, the invention is related to a transistor where the first region is the drain region of the transistor and second region is the substrate contact region of the transistor. The transistor further comprises a gate and a source region, where the third region is present between the source region and the substrate contact region.

According to another embodiment, the device is a Silicon Controlled Rectifier (SCR). The SCR comprises an anode and a cathode, where the first region is connected to the anode, while the second region is connected to the cathode.

According to a further embodiment, the device is a high voltage MOS transistor.

BRIEF DESCRIPTION OF THE DRAWINGS

Exemplary embodiments of the present invention are described herein with reference to the drawings, in which.

DETAILED DESCRIPTION OF EXEMPLARY EMBODIMENTS

Figure 1:
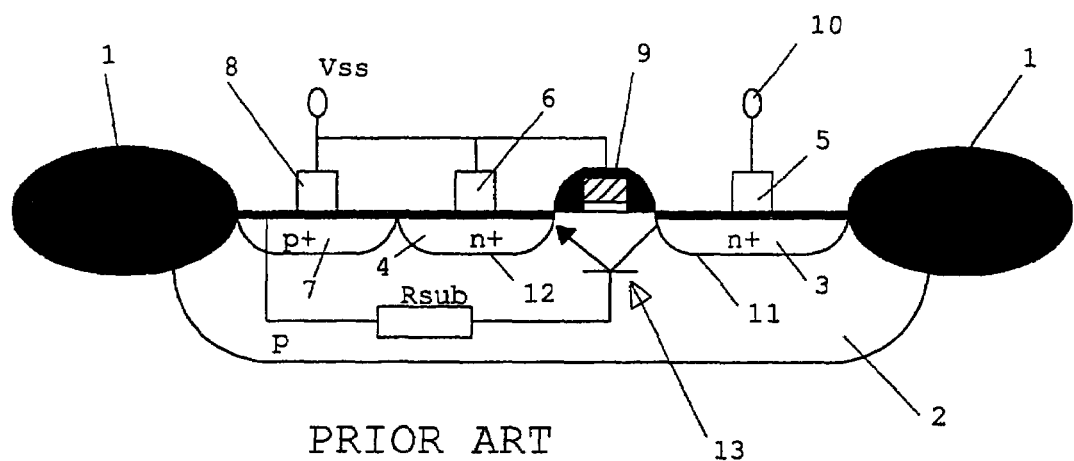
FIG. 1 represents a typical NMOS snapback device known in the art.
Figure 2:
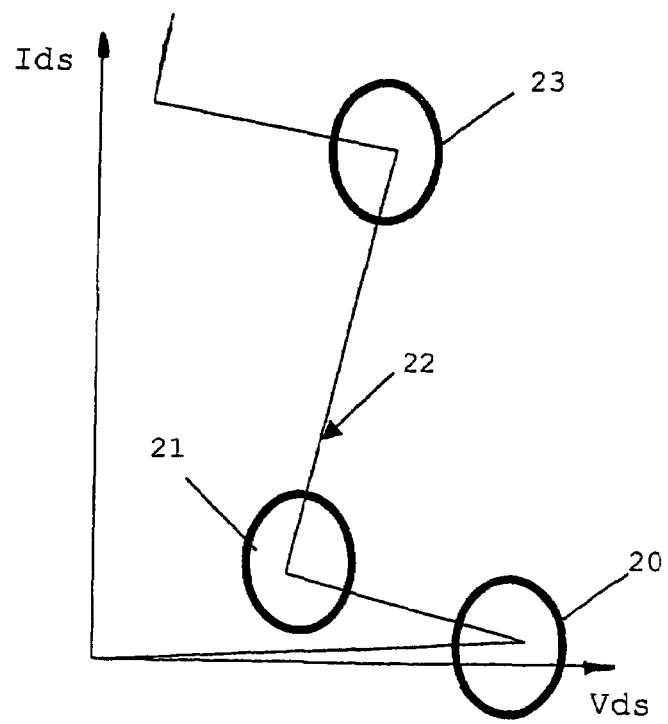
FIG. 2 represents the typical IV characteristic of an ESD protection device.

The operation of an ESD protection device will be described first on the basis of a prior art design of such a device, as shown in FIG. 1, and the accompanying IV-characteristic, as shown in FIG. 2.

The device shown in FIG. 1 is based on an NMOS transistor. The device is placed between two field oxide regions 1. In a p-well region 2, the drain and source regions are defined by heavily n-doped implants 3 and 4, respectively contacted by drain and source contacts 5 and 6, while a heavily doped p-implant forms the substrate contact region 7, contacted by the substrate contact 8. The substrate contact 8, source contact 6 and gate contact 9 are connected to a reference voltage Vss, corresponding normally to ground potential, while the drain contact 5 is connected to the input/output (I/O) terminal 10 of the semiconductor device where an ESD pulse is to be expected.

When a high bias is applied to the drain 3, due to an ESD event, carriers are generated at the drain/substrate junction 11, through impact ionisation or tunnelling because of the high local field. This starts off a substrate current $I_{sub}$ from the drain 3 towards the substrate contact region 7. This current faces the substrate resistance $R_{sub}$, and develops thereby an internal substrate bias $V_{ib}=R_{sub} \cdot I_{sub}$. When this internal bias reaches about 0.7V, the substrate/source junction 12 becomes forward biased and at that moment, the parasitic NPN transistor 13, formed by the heavily n-doped regions 3, 4 and the p-well region 2, is activated, conducting the excess ESD current over a low resistance. This event shows up on the IV characteristic of FIG. 2 at point 20. This point defines the level of external bias voltage applied to the drain, which is responsible for triggering the device into the snap back mode. In this mode, starting from point 21, the IV-characteristic follows the line 22. When the device reaches the point 23, it is destroyed due to internal heating.

In order to optimise any device of this kind, it is always the aim to increase $V_{ib}$, for a given external bias voltage. In other words, the parasitic transistor 13 will be activated sooner, at lower external bias voltages, compared to the reference structures. As stated earlier, prior art solutions to this problem have been concerned with increasing the substrate current $I_{sub}$.

Figure 3:
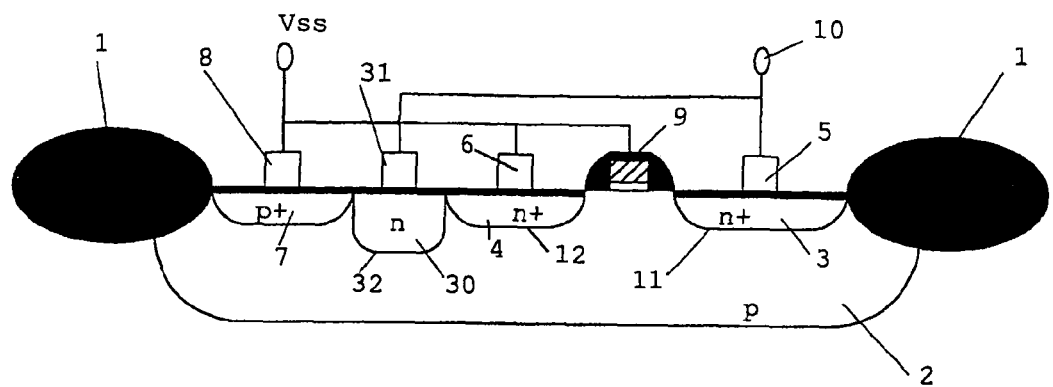
FIG. 3 represents the structure of an ESD protection device according to an embodiment of the present invention.

The present invention is related to a device wherein the same effect as shown in FIG. 2 is sought after, but without increasing the substrate current $I_{sub}$. Instead, it is the substrate resistance $R_{sub}$, which is modified. This is done by providing an additional p/n junction 32 between the drain region 3 and the substrate contact region 7. In FIG. 3, an NMOS transistor is shown according to the invention. It comprises an additional n-well 30 placed in the path of the substrate current $I_{sub}$.

Figure 4:
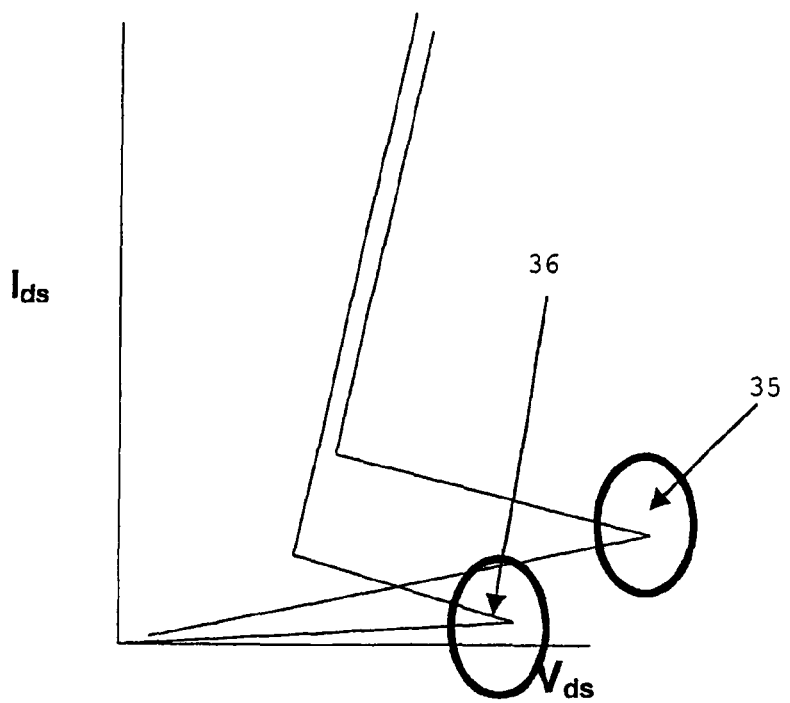
FIG. 4 illustrates the difference in IV characteristic between a prior art device and a device according to embodiments of the invention.

The additional n-well 30 has two functions: first to increase the current path from the drain contact 5 to the substrate contact 8, thereby increasing the equivalent substrate resistance, i.e. the total derivative dV/dI, due to carrier generation and conductivity modulation in the substrate. More importantly however, by reverse biasing the junction 32 between the added n-well 30 and the p-well 2, a depletion zone is formed between this n-well 30 and the p-well 2. Said depletion zone is effectively wider when the reverse bias voltage is increased. The depletion zone increases the resistance $R_{sub}$, which faces the substrate current $I_{sub}$, thereby allowing the required internal bias of 0.7V to be reached at lower substrate current levels, i.e. at lower external bias (ESD pulse) levels. In other words, the device of the invention will trigger sooner into the snap-back mode than the conventional device. This is illustrated in FIG. 4, which compares the generic IV characteristic of the devices of FIGS. 1 and 3 (curves 35 and 36 respectively). It is shown that the snap-back point is at a lower bias voltage for the device of the invention.

According to the preferred embodiment, the additional n-well 30 is connected, via its contact 31 to the drain terminal 10, and thereby receives the same ESD pulses as this drain terminal 10. As the ESD is normally positive versus Vss, the added n-well 30 will be positively biased towards ground and the depletion zone will be larger for a higher ESD pulse. This means that the substrate resistance $R_{sub}$ increases with the ESD bias.

The device of the invention is of course not limited to an NMOS transistor. The same design can be applied to a PMOS transistor, by interchanging the doping types shown in FIG. 3.

Figure 5:
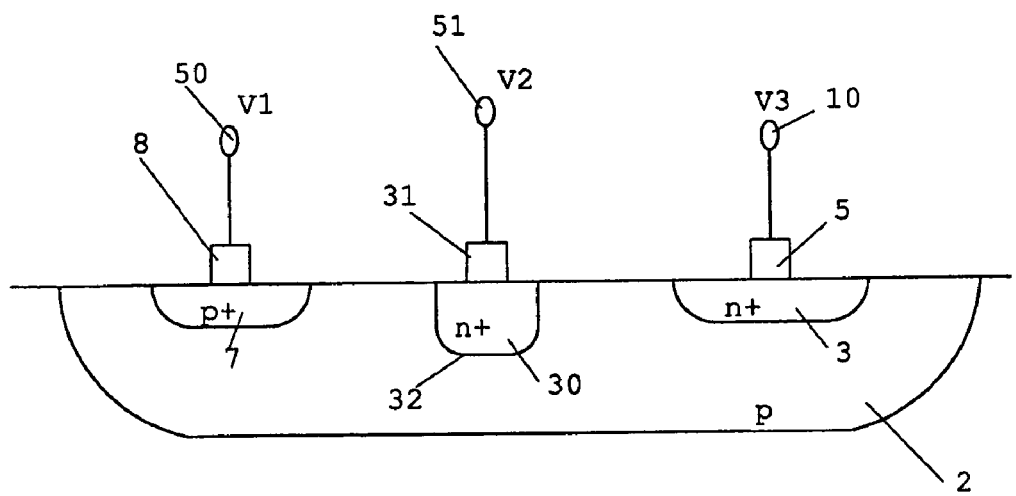
FIG. 5 illustrates the most general concept of a device according to the present invention.

Moreover, the invention is not restricted to a device such as shown in FIG. 3. The basic building blocks of a device of the invention are shown in FIG. 5 (p and n may be interchanged):

- a p-type bulk region 2, for example a p-well or the bulk of a p-type substrate,
- a first region 3 of n-type, in physical contact with said bulk region 2,
- a second region 7 of p-type, equally in physical contact with said bulk region 2, and
- a third region 30 of n-type, equally in physical contact with said bulk region, and positioned in between said first and second region.

The denomination 'physical contact' expresses the circumstance wherein the regions share a common border, which may be a p-n junction or a border between regions of the same doping type. In most cases, the first, second and third regions are implants of a given doping type, which are formed in the larger bulk region 2.

Every one of the first to third regions is connected via contacts (respectively 5, 8 and 31) and terminals (resp. 10, 50 and 51) to given voltage levels (V1, V2, V3). In this description as well as in the appended claims, a region is understood to be 'connected to a terminal' when an external electrical path is present between the region and the terminal. Terminal 10 receives the ESD pulse.

In the preferred working mode of a device of the invention, the voltage levels V1 and V2 have to be such that the junction 32 between region 30 and the bulk region 2 is reversed biased. The junction 32 can be unbiased, if for some reason the voltages V1 and V2 would be momentarily equal, but there can never be a connection between the terminals 50 and 51, which would make it impossible to reverse bias the junction 32 and to control the resistance $R_{sub}$. It is therefore a characteristic of the invention that the additional region 30 does not have an external connection to the reference terminal 50, in other words that this region 30 is floating with respect to said reference terminal.

By connecting the terminals 51 and 10, the resistance $R_{sub}$ will change as a function of the ESD pulse. When the terminals 10 and 51 are not connected, the level V2 and thereby the resistance $R_{sub}$, may be controlled independently from the ESD pulse. Especially in the latter case, care must be taken that the junction 32 does not become forward biased.

It can be seen from the comparison between FIGS. 3 and 5 that the NMOS transistor shown in FIG. 3 indeed comprises the building blocks of FIG. 5. The interconnection between the contacts, as it is shown in FIG. 3 represents a preferred mode, but it is not a limiting aspect of the invention.

It must be emphasized that any device according to the invention comprises more components, than the ones shown in FIG. 5. The invention is explicitly limited to an ESD protection device. ESD protection devices, which are known in the art, consist of more components than the regions 3 and 7 of FIG. 5. The basic idea of the invention is to present a device which is based on a known ESD protection device, but which comprises an additional p-n junction in the path of the desired substrate current flow, in order to change the internal substrate resistance Rsub, of that path. In addition, in the preferred mode, the presented approach provides an additional current path through the reverse biased additional junction for the ESD stress current which helps to increase the overall robustness of the structure. Even if the additional junction 32 is reverse biased, it can take a (small) amount of ESD current, as junction reverse leakage current, if the junction 32 is connected to the ESD terminal 10. The majority of the ESD current however goes into the region 3.

Figure 6:
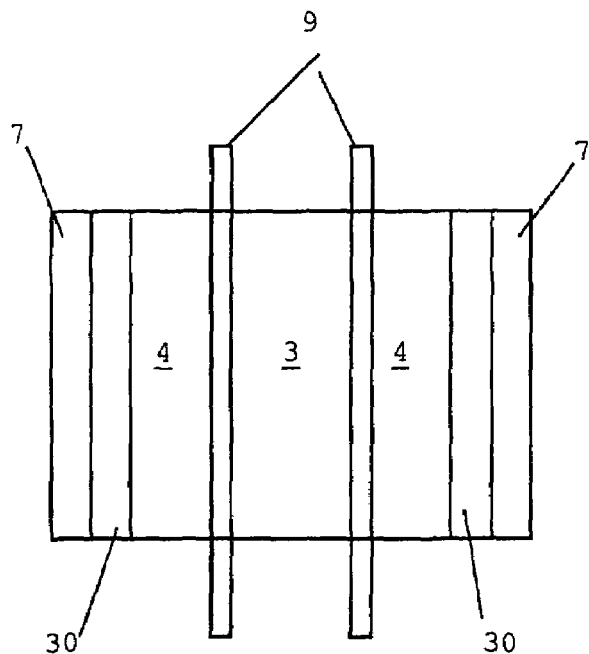
FIGS. 6, 7, and 8 show alternative realization forms corresponding to various embodiments of the invention.
Figure 7:
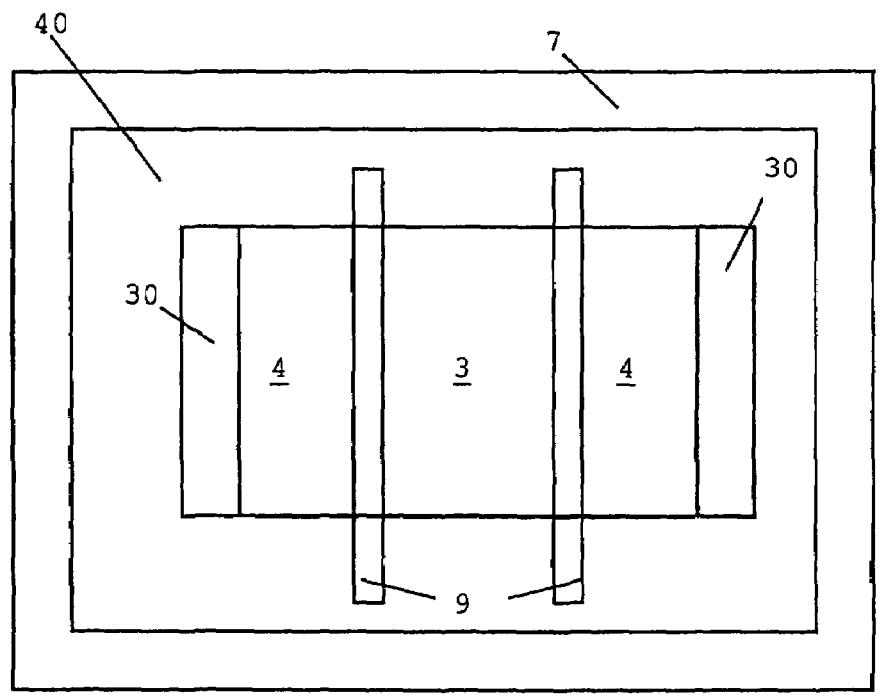
Figure 8:
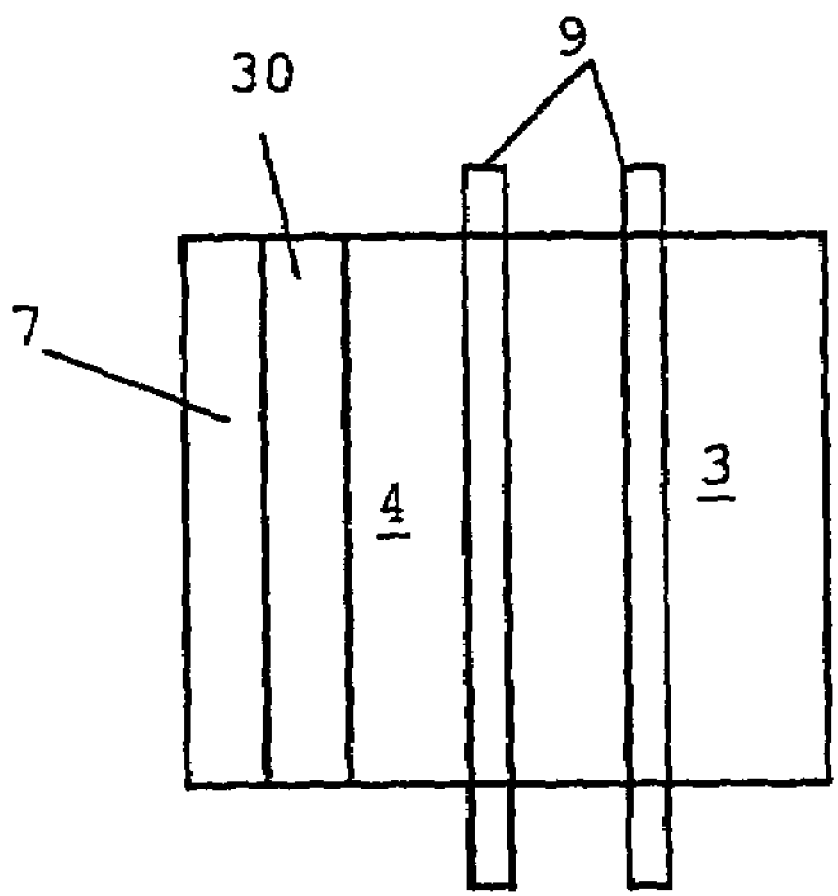

Other examples of CMOS transistors according to the invention are shown in FIGS. 6, 7 and 8, in plane view. For simplicity, only rectangular shaped device regions are shown. Other shapes-like squares, octo- and hexagonals and others are possible, as they are not limiting the application of the novel approach. The structures in FIGS. 6–8 can be multiple times reproduced in parallel, to form an N-finger device, as know in the art. FIG. 6 represents a two finger structure, having one drain 3, two gates 9, connected at the same potential, two sources 4 and two substrate contact regions 7. An additional well 30 (n or p, depending on the doping type of regions 3, 4 and 7) is always added in the path between the drain and substrate contacts, 3 and 7 respectively. In FIG. 7, the substrate contact region 7 is designed as a guard ring around the gate/source/drain assembly, with an oxide region 40 in between. FIG. 8 shows a dual gate structure, with one drain 3, one source 4 and two gates, 90 and 91, connected at different potentials. Furthermore there is the substrate contact region 7 and the additional n-well (or p-well) 30.

Figure 9A:
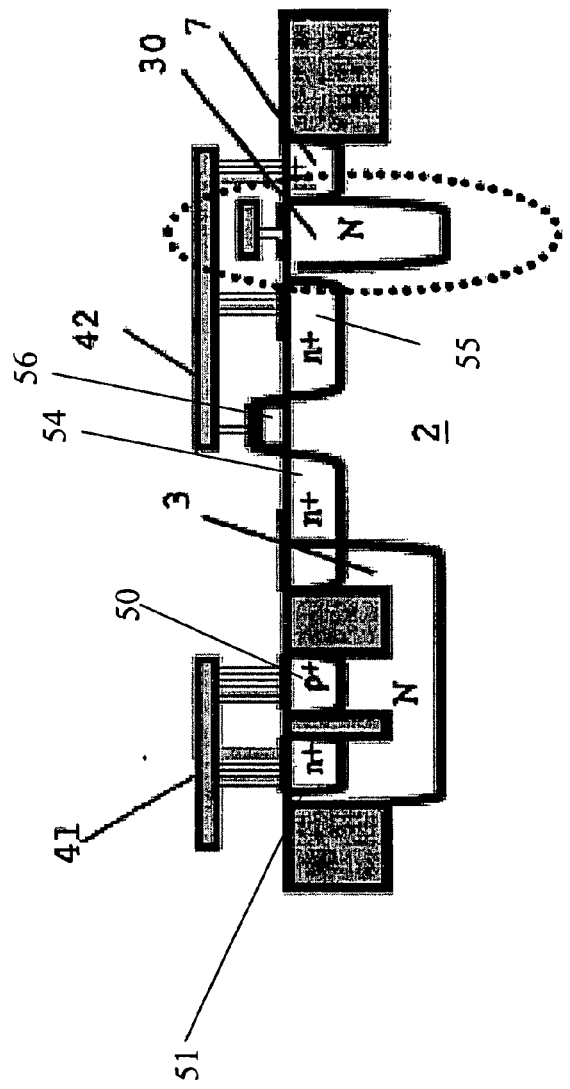
FIG. 9 shows an SCR structure according to an embodiment of the invention.
Figure 9B:
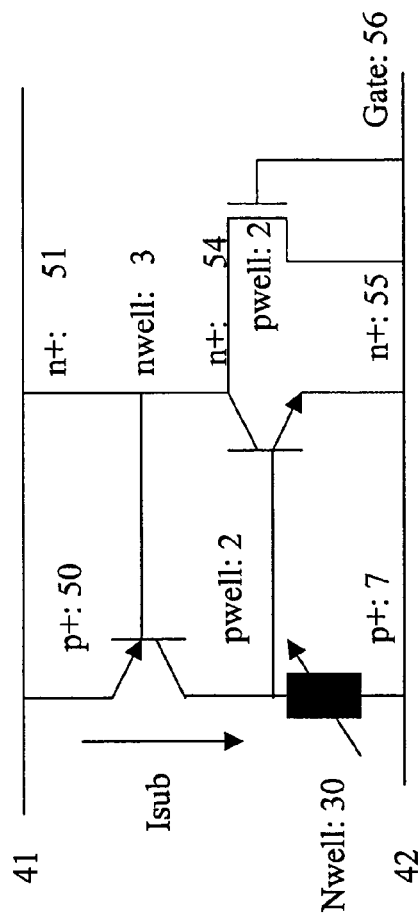

Another application is a Silicon Controlled Rectifier (SCR) device as shown in FIG. 9*a*. The device has an anode 41, to which the ESD pulse is applied, and a cathode 42, to which the reference terminal bias Vss is applied. The device is placed in a p-substrate 2. The n-region under the anode 41 corresponds to region 3 in the general concept drawing of FIG. 5. The p+ region in connection with the cathode 42 corresponds to region 7 of FIG. 5. Finally, an additional n-well 30 is present in the SCR design of FIG. 9*a*, making this device comply with the basic characteristics of the present invention. FIG. 9*b* shows the electrical equivalent of the SCR device of FIG. 9*a*. Numerical references 54, 55, 56, 60 and 61 are related to sub-parts, as indicated, of the SCR device. These references are repeated in the equivalent scheme of FIG. 9*b*.

Figure 10:
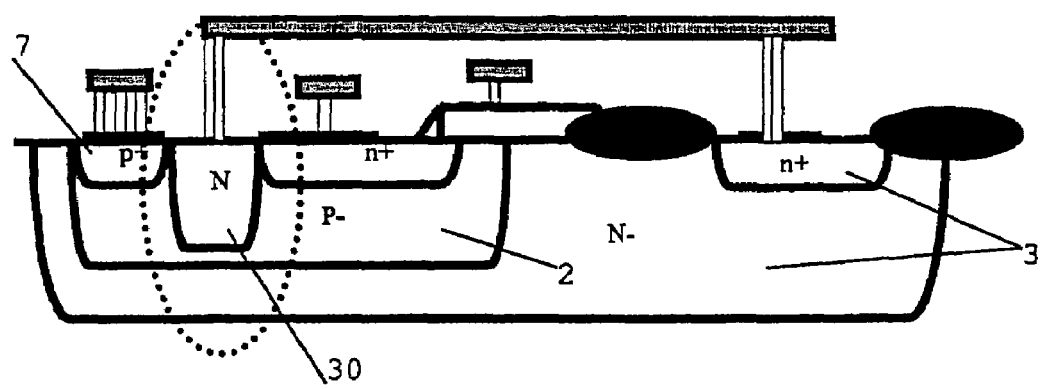
FIG. 10 shows as embodiment of the invention, a High Voltage MOS transistor designed according to the present invention.

The additional n-well region 30 is shown as voltage controlled resistor in the current path via the pnp transistor (60,3,2) towards the cathode 42. Other known ESD SCR devices might be adapted by addition of a region 30, to become devices according to the present invention. Another example of a device of the invention is shown in FIG. 10. This is a High Voltage MOS transistor, comprising a region 3, formed by the drain and by an n-well underneath the complete device, a p-bulk region 2, a p-region 7, and in between the two, an n-well 30. All regions are equivalent to the corresponding regions in FIG. 3 and FIG. 5.

We claim:

1. A semiconductor device for protecting electrical circuits from Electrostatic Discharge pulses, said device comprising:
    a bulk region of a given doping type,
    a first region of a doping type, opposite the doping type of said bulk region, said first region being in physical contact with said bulk region, said first region being connected to a first terminal to which an ESD pulse can be applied,
    a second region of the same doping type as said bulk region, said second region being in physical contact with said bulk region, said second region being connected to a second terminal to which a reference voltage (Vss) can be applied,
    characterized in that said device further comprises a third region, which is equally in physical contact with said bulk region, and which is positioned in between said first and second region, said third region being of the same doping type as said first region but being lower doped than said first region, and wherein said third region is floating with respect to said second terminal, said third region being used for increasing the resistance (Rsub) of a current path, through said bulk region, between said first and second region.

2. The device of claim 1, wherein said third region is connected to an external terminal.

3. The device of claim 2, wherein said external terminal is separate from said first terminal.

4. The device of claim 2, wherein said external terminal is connected to said first terminal.

5. The device of claim 2, wherein the junction between said third region and said bulk region is reversed biased.

6. The device of claim 5, wherein said device is a transistor, and wherein said first region is the drain region of said transistor, said second region is the substrate contact region of said transistor, said transistor further comprising a gate and a source region, and wherein said third region is present between said source region and said substrata contact region.

7. The device of claim 5, wherein said device is a Silicon Controlled Rectifier (SCR), comprising an anode and a cathode and wherein said first region is connected to said anode, while said second region is connected to said cathode.

8. The device of claim 5, wherein said device is a high voltage MOS transistor.

9. The device of claim 2, wherein said device is a transistor, and wherein said first region is the drain region of said transistor, said second region is the substrate contact region of said transistor, said transistor further comprising a gate and a source region, and wherein said third region is present between said source region and said substrate contact region.

10. The device of claim 2, wherein said device is a Silicon Controlled Rectifier (SCR), comprising an anode and a cathode and wherein said first region is connected to said anode, while said second region is connected to said cathode.

11. The device of claim 2, wherein said device is a high voltage MOS transistor.

12. The device of claim 1, wherein the junction between said third region and said bulk region is reversed biased.

13. The device of claim 12, wherein said device is a transistor, and wherein said first region is the drain region of said transistor, said second region is the substrate contact region of said transistor, said transistor further comprising a gate and a source region, and wherein said third region is present between said source region and said substrate contact region.

14. The device of claim 12, wherein said device is a Silicon Controlled Rectifier (SCR), comprising an anode and a cathode and wherein said first region is connected to said anode, while said second region is connected to said cathode.

15. The device of claim 12, wherein said device is a high voltage MOS transistor.

16. The device of claim 1, wherein said device is a transistor, and wherein said first region is the drain region of said transistor, said second region is the substrate contact region of said transistor, said transistor further comprising a gate and a source region, and wherein said third region is present between said source region and said substrate contact region.

17. The device of claim 1, wherein said device is a Silicon Controlled Rectifier (SCR), comprising an anode and a cathode and wherein said first region is connected to said anode, while said second region is connected to said cathode.

18. The device of claim 1, wherein said device is a high voltage MOS transistor.

19. The transistor of claim 1, wherein said transistor is a nMOS transistor, and said third region is a n-well region.

20. A transistor for protecting electrical circuits from Electrostatic Discharge pulses, said transistor comprising:
   a bulk region of a given type,
   a drain region of a doping type, opposite the doping type of said bulk region, said drain region being in physical contact with said bulk region, said drain region being connected to a first terminal to which an ESD pulse can be applied,
   a source region and a gate,
   a substrate contact region of the same doping type as said bulk region, said substrate contact region being in physical contact with said bulk region, said substrate contact region being connected to a second terminal to which a reference voltage (Vss) can be applied,
   characterized in that said transistor further comprises a third region, which is equally in physical contact with said bulk region, and which is positioned in between said source region and said substrate contact region, said third region being of the same doping type as said drain region but being lower doped than said drain region, and wherein said third region is floating with respect to said second terminal, said third region being adapted for increasing the resistance (Rsub) of a current path, through said bulk region, between said drain and substrate contact region.

21. The transistor of claim 20, wherein said third region is connected to said first terminal and said increase in said resistance is proportional to said Electrostatic Discharge pulses.

* * * * *